(12) United States Patent
Zhang (10) Patent No.: US 10,819,084 B2
(45) Date of Patent: Oct. 27, 2020

(54) TO-CAN PACKAGED LASER AND OPTICAL MODULE

(71) Applicant: Hisense Broadband Multimedia Technologies Co., Ltd., Qingdao (CN)

(72) Inventor: Lingyan Zhang, Qingdao (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 0 days.

(21) Appl. No.: 16/119,647

(22) PCT Filed: May 31, 2018

(86) PCT No.: PCT/CN2018/089216
§ 371 (c)(1),
(2) Date: Aug. 31, 2018

(87) PCT Pub. No.: WO2018/219318
PCT Pub. Date: Dec. 6, 2018

(65) Prior Publication Data
US 2020/0203922 A1 Jun. 25, 2020

(30) Foreign Application Priority Data

Jun. 2, 2017 (CN) .......................... 2017 1 0405879
Aug. 16, 2017 (CN) .......................... 2017 1 0701458

(51) Int. Cl.
*H01S 5/022* (2006.01)
*H01S 5/024* (2006.01)

(52) U.S. Cl.
CPC ...... *H01S 5/02212* (2013.01); *H01S 5/02256* (2013.01); *H01S 5/02276* (2013.01); *H01S 5/02415* (2013.01)

(58) Field of Classification Search
CPC . H01S 5/02212; H01S 5/02415; H01S 5/0683
See application file for complete search history.

(56) References Cited

U.S. PATENT DOCUMENTS

| 4,649,545 A | 3/1987 | Lee et al. |
| 7,366,215 B2 * | 4/2008 | Aruga ................. H01S 5/02276 372/38.05 |

(Continued)

FOREIGN PATENT DOCUMENTS

| CN | 2457763 Y | 10/2001 |
| CN | 2468069 Y | 12/2001 |

(Continued)

OTHER PUBLICATIONS

State Intellectual Property Office of the People's Republic of China, Office Action and Search Report Issued in Application No. 201710405879.1 dated Apr. 25, 2019; 14 pages (submitted with machine translation).

(Continued)

*Primary Examiner* — Michael Carter
(74) *Attorney, Agent, or Firm* — Brinks Gilson & Lione (57) ABSTRACT

The present disclosure provides a TO-CAN packaged laser and an optical module. According to an example, the TO-CAN packaged laser includes a base; a substrate located on the base, where the substrate is provided with a first conductive sheet and a second conductive sheet; a laser chip provided on the substrate, where an anode of the laser chip is electrically coupled with the first conductive sheet and a cathode of the laser chip is electrically coupled with the second conductive sheet; and a first pin and a second pin that protrude from the base, where the first pin is coupled with the first conductive sheet by conductive welding flux or conductive paste and the second pin is coupled with the second conductive sheet by conductive welding flux or conductive paste.

18 Claims, 7 Drawing Sheets

(56) References Cited

U.S. PATENT DOCUMENTS

| | | | |
|---|---|---|---|
| 7,991,029 B2* | 8/2011 | Aruga | H05K 1/0243 257/706 |
| 2001/0011767 A1* | 8/2001 | Osawa | H01L 23/24 257/691 |
| 2003/0179055 A1* | 9/2003 | Sweeney | H01P 1/047 333/246 |
| 2004/0188698 A1 | 9/2004 | Ishimura | |
| 2007/0120134 A1 | 5/2007 | Oshima et al. | |
| 2015/0008552 A1 | 1/2015 | Matsusue | |
| 2016/0276802 A1* | 9/2016 | Gao | H01S 5/02212 |

FOREIGN PATENT DOCUMENTS

| | | | | |
|---|---|---|---|---|
| CN | 1674373 | A | | 9/2005 |
| CN | 2796195 | Y | | 7/2006 |
| CN | 1829013 | A | | 9/2006 |
| CN | 102650718 | | * 8/2012 | ............ H01S 5/022 |
| CN | 102650718 | A | | 8/2012 |
| CN | 202423821 | U | | 9/2012 |
| CN | 202602083 | U | | 12/2012 |
| CN | 203415815 | U | | 1/2014 |
| CN | 104205529 | A | | 12/2014 |
| CN | 107508141 | A | | 12/2014 |
| CN | 204696445 | U | | 10/2015 |
| CN | 204793611 | U | | 11/2015 |
| CN | 106054327 | A | | 10/2016 |
| JP | 2001-288565 | A | | 10/2001 |
| JP | 2011-13470 | A | | 7/2011 |
| JP | 2011-134740 | A | | 7/2011 |
| JP | 201134740 | A | | 7/2011 |

OTHER PUBLICATIONS

State Intellectual Property Office of the People's Republic of China, Office Action and Search Report Issued in Application No. 201710701458.3, dated Aug. 14, 2019, 11 pages, (Submitted with Machine Translation).

World International Property Organization; International Search Report issued in International Application No. PCT/CN2018/089216 dated Jul. 24, 2018; 4 pages.

* cited by examiner

TO-CAN PACKAGED LASER AND OPTICAL MODULE

CROSS REFERENCE TO RELATED APPLICATIONS

This application is the national stage application under 35 U.S.C. § 371 of PCT Application No. PCT/CN2018/089216, filed on May 31, 2018, and which claims priority to Chinese Patent Application No. 201710405879.1, entitled "TO-CAN PACKAGED LASER AND OPTICAL MODULE" filed on Jun. 2, 2017, and Chinese Patent Application No. 201710701458.3, entitled "TO-CAN PACKAGED LASER AND OPTICAL MODULE" filed on Aug. 16, 2017, the entirety of all of which are hereby incorporated by reference herein.

TECHNICAL FIELD

The present disclosure relates to a TO-CAN packaged laser and an optical module.

BACKGROUND

With increasingly higher requirements for information quality such as data and image, a transmission rate of an optical module become increasingly faster. One of main devices in an optical module is a laser-emitting component (such as, a laser chip). To meet the requirement of high transmission rate, it is required that the transmission rate of the laser-emitting component meets the requirement of high transmission rate, and a packaging technology supporting high-speed packaging is also required. For example, a TO-CAN packaging technology is quite mature for applications with transmission rates less than 25 Gb/s. However, the TO-CAN packaging technology requires to be further improved for applications with transmission rates being 25 Gb/s or higher.

SUMMARY

Examples of the present disclosure provide a TO-CAN packaged laser and an optical module, which can shorten a distance of wire bonding and facilitate signal transmission between a pin and a laser chip.

In one aspect, a TO-CAN packaged laser is provided in the present disclosure, which includes:
  a base;
  a substrate located on the base, where the substrate is provided with a first conductive sheet and a second conductive sheet;
  a laser chip provided on the substrate, where an anode of the laser chip is electrically coupled with the first conductive sheet and a cathode of the laser chip is electrically coupled with the second conductive sheet; and
  a first pin and a second pin that protrude from the base, where the first pin is coupled with the first conductive sheet by conductive welding flux or conductive paste and the second pin is coupled with the second conductive sheet by conductive welding flux or conductive paste.

In another aspect, an optical module is provided in the present disclosure, which includes a TO-CAN packaged laser, where the TO-CAN packaged laser includes:
  a base;
  a substrate located on the base, where the substrate is provided with a first conductive sheet and a second conductive sheet;
  a laser chip provided on the substrate, where an anode of the laser chip is electrically coupled with the first conductive sheet and a cathode of the laser chip is electrically coupled with the second conductive sheet; and
  a first pin and a second pin that protrude from the base, where the first pin is coupled with the first conductive sheet by conductive welding flux or conductive paste and the second pin is coupled with the second conductive sheet by conductive welding flux or conductive paste.

In the present disclosure, the pin is coupled with the conductive sheet by conductive welding flux or conductive paste, thereby shortening a distance of wire bonding and facilitating signal transmission.

BRIEF DESCRIPTION OF DRAWINGS

To describe the technical solutions of examples of the present disclosure more clearly, the following is a brief description of drawings which are applied for description of examples of the present disclosure or prior arts. It is apparent that the drawings in the description below are merely a part of examples of the present disclosure. Other drawings may be obtained by a person skilled in the art based on these drawings without paying creative work.

DETAILED DESCRIPTION

The technical solutions of examples of the present disclosure will be described clearly and fully below in combination with drawings in the examples of the present disclosure. It is apparent that the described examples are merely a part of examples of the present disclosure rather than all examples. Other examples obtained by a person skilled in the art based on the examples in the present disclosure without paying creative work shall all fall into the scope of protection of the present disclosure. To further describe the principle and the structure of the present disclosure, detailed descriptions will be made to the preferred examples of the present disclosure in combination with the drawings.

Figure 1:
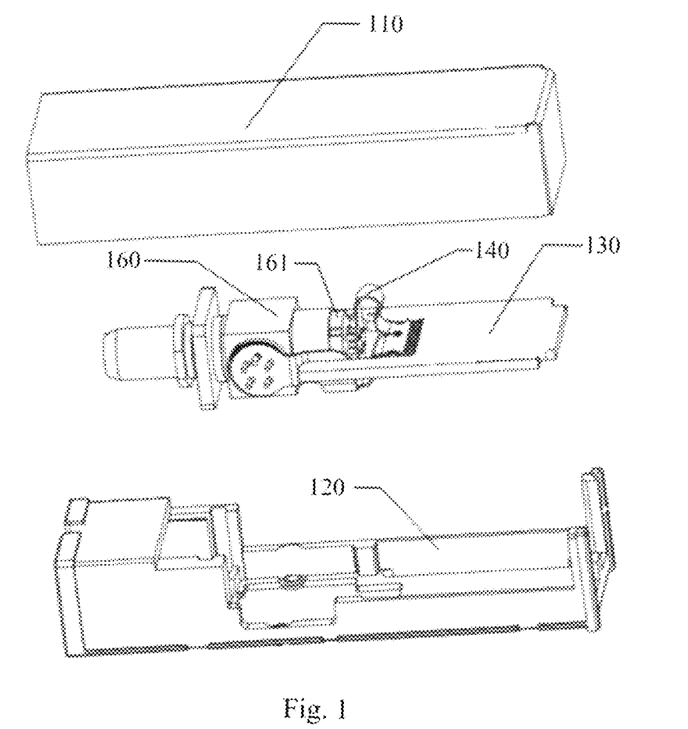
FIG. 1 is a schematic diagram illustrating a structure of an optical module according to an example of the present disclosure.

FIG. 1 is a schematic diagram illustrating an optical module according to an example of the present disclosure. As shown in FIG. 1, the optical module may include an upper housing 110, a lower housing 120, a printed circuit board 130, a flexible circuit board 140 and an optical component 160. The upper housing 110 and the lower housing 120 may form a cavity. The optical component 160, the flexible circuit board 140, and the printed circuit board 130 may all be accommodated in the above cavity. The optical component 160 is electrically coupled with the printed circuit board 130 through the flexible circuit board 140. The optical component 160 may further include a TO-CAN packaged laser 161.

Figure 2:
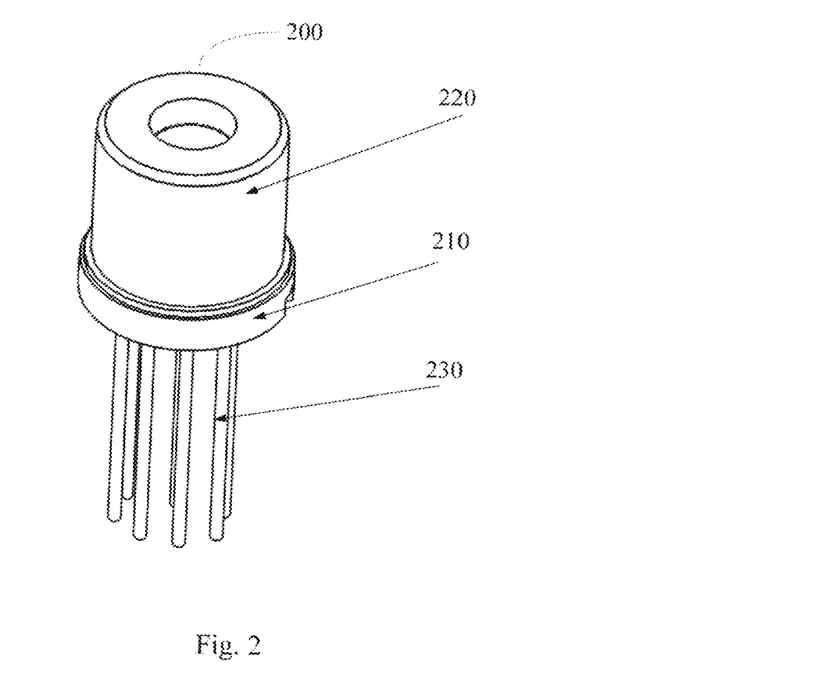
FIG. 2 is a schematic diagram illustrating a structure of a TO-CAN packaged laser according to an example of the present disclosure.

FIG. 2 is a schematic diagram illustrating an external structure of a TO-CAN packaged laser 200 according to an example of the present disclosure. As shown in FIG. 2, the laser 200 may include a base 210 and a pin cap 220 for packaging the base 210. An upper surface of the base 210 may be provided with photoelectric devices (not shown in FIG. 2) and the pin cap 220 may include a lens window through which a laser beam can pass. A plurality of pins 230 may penetrate through the base 210 and protrude from the upper surface of the base 210. Contacts between the pins 230 and the base 210 may be wrapped by insulating medium, such as glass to implement insulation between the pins 230 and the base 210. The photoelectric devices may be packaged between the base 210 and the pin cap 220, and electrically coupled with external via the pins 230 penetrating through the base 210.

Figure 3:
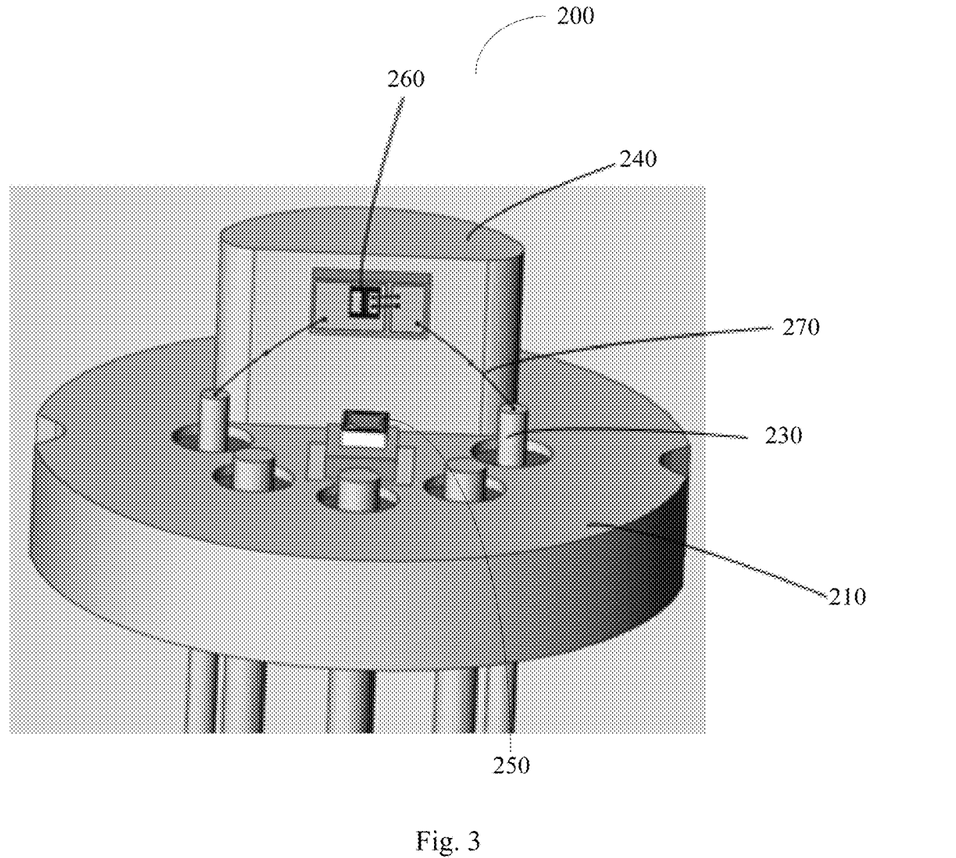
FIG. 3 is a schematic diagram illustrating an internal structure of the TO-CAN packaged laser in FIG. 2.

FIG. 3 is a schematic diagram illustrating an internal structure of the TO-CAN packaged laser 200 in FIG. 2. As shown in FIG. 3, a substrate 240 and an optical detector 250 may be disposed on the upper surface of the base 210. The pins 230 may be distributed around the optical detector 250. A laser chip 260 may be attached on a side surface of the substrate 240. The laser chip 260 may be located above the optical detector 250. An edge of the laser chip 260 may emit two laser beams vertical to the upper surface of the base 210. One of the two laser beams emitted to the pin cap 220 may be emitted from the lens window and the other laser beam emitted to the optical detector 250 may be used to implement an optical power monitoring function.

The plurality of pins 230 may penetrate through the base 210 and protrude from the upper surface of the base 210. It is noted that a length that the pins 230 protrude from the upper surface of the base 210 cannot not be too long, so as to prevent inductance effect of the pins 230 from affecting quality of signal transmission. In this way, the pins 230 cannot be close to the laser chip 260 on the side surface of the substrate 240 with a relative short distance.

Such photoelectric devices as the laser chip 260 and the optical detector 250 may be electrically coupled with the corresponding pins by wire bonding. In an example, a pin may be electrically coupled with the laser chip 260 by a gold wire 270. Since the length that the pin protrudes from the upper surface of the base 210 cannot be too long, the pin cannot be close to the laser chip 260 on the side surface of the substrate 240 with a relative short distance. In addition, since one of the two laser beams emitted by the laser chip 260 will enter the optical detector 250 on the upper surface of the base 210, the optical detector 250 also cannot be close to the pin with a relative short distance. Therefore, a distance between the laser chip 260 and the pin may be relatively longer, thereby adversely affecting signal transmission.

A distance of wire bonding between the laser chip 260 and the pin is important for performance of a high speed device. Wire bonding may be equivalent to a component having electric resistance and inductance characteristics in high frequency characteristics. The longer the distance of wire bonding is, the larger parasitic inductance is. In addition, since there are many uncontrollable factors for a distance of wire bonding and loop height in production, it is difficult to accurately pre-estimate resistance and inductance effect actually equivalent to the wire bonding and therefore performances of devices are uncontrollable. Further, the introduction of the resistance and the inductance may bring an impact on high frequency characteristics of devices, thereby adversely affecting high frequency transmission. Therefore, in a process of packaging high speed devices, it is desired that the distance of wire bonding is short as possible and the loop height is low as possible, so as to reduce parasitic parameters and improve performances of devices.

Figure 4:
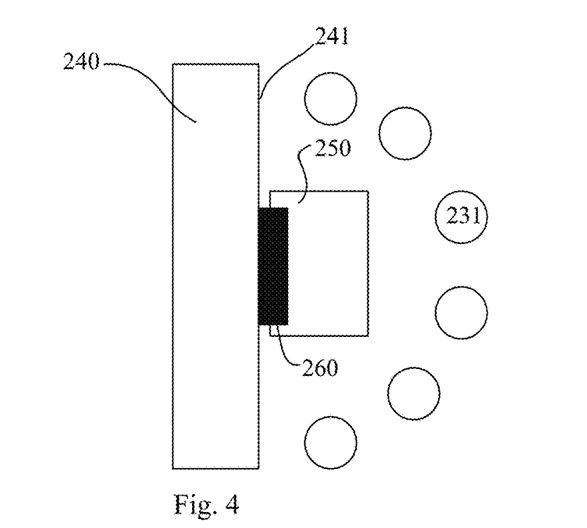
FIG. 4 is a schematic diagram illustrating a top view of the TO-CAN packaged laser in FIG. 3.

FIG. 4 is a schematic diagram a top view illustrating the TO-CAN packaged laser 200 in FIG. 3. As shown in FIG. 4, the laser chip 260 is attached on the side surface 241 of the substrate 240. The optical detector 250 is located under the laser chip 260. Due to the presence of the optical detector 250, a pin 231 cannot be further close to the laser chip 260 with a relative short distance. Moreover, the other pins may be arranged in an arc shape around the optical detector 250 to be as close as possible to the photoelectric devices which are attached on the side surface 241 of the substrate 240. FIG. 4 only illustrates an arrangement shape of pins. In practice, the pins may be arranged in a plurality of shapes. However, to avoid the optical detector 250 and be as close as possible to the photoelectric devices which are attached on the side surface 241 of the substrate 240, the pins 230 may surround the optical detector 250. Further, to facilitate wire bonding with the photoelectric devices which are attached on the side surface 241 of the substrate 240, the pins 230 may be close to the side surface 241 of the substrate 240.

As shown in FIG. 4, if without the optical detector 250, the pin 231 may become one of the pins that are closest to the laser chip 260. However, there is still a relatively long distance between the pin 231 and the laser chip 260 due to the presence of the optical detector 250.

Figure 5:
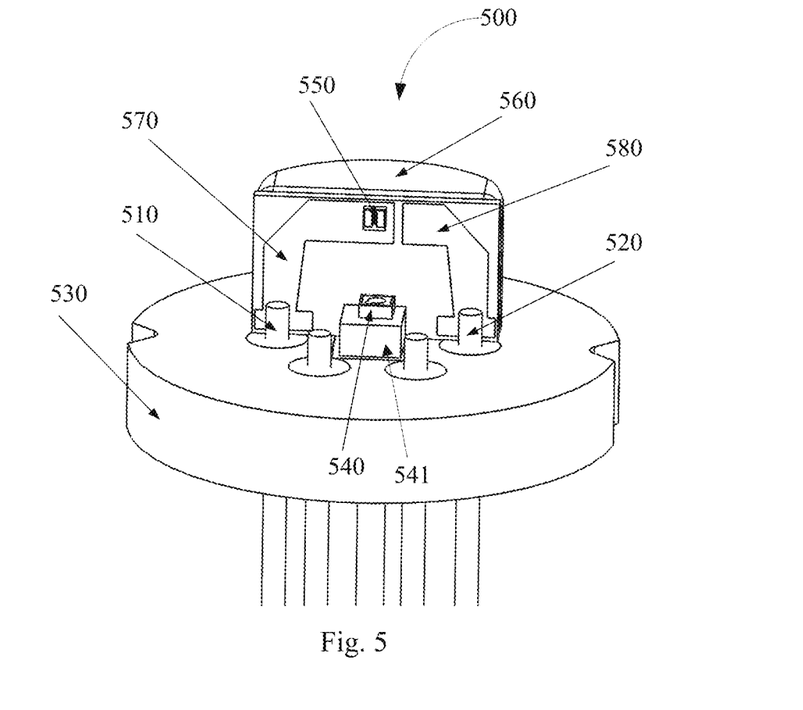
FIG. 5 is a schematic diagram illustrating a structure of a TO-CAN packaged laser according to an example of the present disclosure.

FIG. 5 is a schematic diagram illustrating a structure of a TO-CAN packaged laser 500 according to an example of the present disclosure. As shown in FIG. 5, the TO-CAN packaged laser 500 may include a first pin 510, a second pin 520, a base 530, an optical detector 540, a laser chip 550 and a substrate 560 located on the base 530.

A side surface of the substrate 560 may be provided with a first conductive sheet 570, a second conductive sheet 580 and a laser chip 550. An anode of the laser chip 550 may be electrically coupled with the first conductive sheet 570 and a cathode of the laser chip 550 may be electrically coupled with the second conductive sheet 580. The laser chip 550 is disposed on the side surface of the substrate 560 with the first conductive sheet 570 or the second conductive sheet 580. For example, in some cases, the laser chip 550 may be attached on the first conductive sheet 570 or the second conductive sheet 580.

In an example, as shown in FIG. 5, the laser chip 550 is fixed on the side surface of the substrate 560 by being attached on the first conductive sheet 570, and at the same time the electrical connection between the anode of the laser chip 550 and the first conductive sheet 570 is implemented. The cathode of the laser chip 550 may be electrically coupled with the second conductive sheet 580 through wire bonding.

In an example, as shown in FIG. 5, the laser chip 550 is fixed on the side surface of the substrate 560 by being attached on the first conductive sheet 570, and at the same time the electrical connection between the cathode of the laser chip 550 and the first conductive sheet 570 is implemented. The anode of the laser chip 550 may be electrically coupled with the second conductive sheet 580 through wire bonding.

In an example, the laser chip 550 is directly fixed on the substrate 560. The two electrode of the laser chip 550 is respectively electrically coupled with the first conductive sheet 570 and the second conductive sheet 580 through wire bonding.

The optical detector 540 may be located between the base 530 and the laser chip 550 so as to receive a laser beam emitted by the laser chip 550. In an example, the optical detector 540 is located on a sub-substrate 541 (such as a ceramic sub-substrate), and the sub-substrate 541 is located on the base 530.

The first pin 510 and the second pin 520 may protrude from the upper surface of the base 530 and be located at two opposite sides of the optical detector 540 respectively. It is noted that the pins protruding from the upper surface of the base 530 shall avoid the optical detector 540. Therefore, the pins may be slightly farther away from the laser chip 550.

In an example, the first conductive sheet 570 may be welded with the first pin 510 and the second conductive sheet 580 may be welded with the second pin 520. Thus, power supply to the anode and the cathode of the laser chip 550 may be implemented to drive the laser chip 550 to emit laser beams. In an example, current input to the laser chip 550 may be a sum of bias current and modulated current, so that the laser chip 550 may directly emit laser beams carrying signals.

In the TO-CAN packaged laser 200 in FIGS. 2-4, the laser chip 260 may be coupled with the pins 230 through wire bonding, which can lead to a relatively long distance of wire bonding. However, in FIG. 5, the substrate 560 is located on the upper surface of the base 530, the pins 510, 520 protrude from the upper surface of the base 530, and the first conductive sheet 570, the second conductive sheet 580 and the laser chip 550 are located at the side surface, close to the pins 510, 520 of the substrate 560. In this way, the optical detector 540 may receive a laser beam emitted by the laser chip 550, thereby implementing an optical power monitoring function. The first pin 510 and the second pin 520 respectively located at two opposite sides of the optical detector 540 may protrude from the upper surface of the base 530 and be close to the conductive sheets 570, 580 on the side surface of the substrate 560, thereby facilitating welding. Compared to the TO-CAN packaged laser 200 in FIGS. 2-4, the TO-CAN packaged laser 500 in FIG. 5 may allow electric connection between the laser chip 550 and the pins 510, 520 through welding between the pins and the conductive sheets as well as wire bonding of short distance between the conductive sheets and the laser chip, thereby shortening the length of wire bonding and facilitating high speed signal transmission.

In an example, the first pin 510 and the second pin 520 may be high speed pins. The TO-CAN packaged laser 500 may include high speed pins and ordinary pins. The high speed pins may be used to transmit high speed signals and the ordinary pins may be used to implement non-high-speed electrical connection. The high speed pins and the ordinary pins may all be located at a same side, at which the laser chip 550 is provided, of the substrate 560, thereby facilitating being electrically coupled with the laser chip 550 on the side surface of the substrate 560 by wire bonding. Compared to the TO-CAN packaged laser 200 in FIGS. 2-4, it can be seen that in the TO-CAN packaged laser 500 in FIG. 5, the high speed pins (for example, the first pin 510 and the second pin 520) may be closer to the substrate 560 than the ordinary pins, and a distance between the side surface, being provided with the laser chip 550, of the substrate 560 and the high speed pins may be shorter than a distance between the side surface, being provided with the laser chip 550, of the substrate 560 and the ordinary pins, thereby facilitating welding of the high speed pins and the conductive sheets.

In an example, the laser chip 550 may emit two laser beams that are opposite in transmission direction but vertical to the upper surface of the base 530. One of the two laser beams is emitted out of the laser 500 and the other is emitted into the optical detector 540 so as to implement optical power monitoring. In this case, as shown in FIG. 5, the laser chip 550 may be attached to the side surface of the substrate 560 and the laser chip 550 may be located above the optical detector 540.

Photoelectric devices such as the laser chip 550, a laser-driving chip, an electric resistor and so on which are provided on the substrate 560 may be arranged on a same side surface of the substrate 560. In this way, other side surfaces of the substrate 560 may be used to dissipate heat, thereby implementing a better heat dissipation effect. In this case, the pins may be provided at the side, at which the photoelectric devices are located, of the substrate 560, and electrically coupled with the photoelectric devices by welding and wire bonding.

In an example, the side surface, being provided with photoelectric devices, of the substrate 560 may be provided with the first conductive sheet 570 and the second conductive sheet 580. Further, the anode of the laser chip 550 may be electrically coupled with the first conductive sheet 570 and the cathode of the laser chip 550 may be electrically coupled with the second conductive sheet 580. The first conductive sheet 570 may be directly contacted with the first pin 510 and the second conductive sheet 580 may be directly contacted with the second pin 520. In this way, electrical connection between the first pin 510, the second pin 520 and the laser chip 550 may be implemented through the first conductive sheet 570 and the second conductive sheet 580. Alternatively, the first pin 510 may be coupled with the first conductive sheet 570 by conductive welding flux or conductive paste. The second pin 520 may be coupled with the second conductive sheet 580 by conductive welding flux or conductive paste.

In an example, the first pin 510 and the second pin 520 may be close to the side surface, being provided with photoelectric devices, of the substrate 560 as possible, so that direct contact between the first pin 510 and the first conductive sheet 570 and direct contact between the second pin 520 and the second conductive sheet 580 may be implemented. In an example, the first conductive sheet 570 and the second conductive sheet 580 may extend to the upper surface of the base 530 as possible along the side surface of the substrate 560, so that the first conductive sheet 570 and the second conductive sheet 580 can be directly contacted with the first pin 510 and the second pin 520 respectively. Electric insulation is provided between the first conductive sheet 570 and the second conductive sheet 580. The first conductive sheet 570 and the second conductive sheet 580 may be set on the side surface, being provided with photoelectric devices, of the substrate 560 as large as possible.

In an example, the base 530 is provided with the substrate 560 for installing the laser chip 550 and the base 530 is also provided with the optical detector 540 for detecting the laser beam emitted by the laser chip 550. The side surface, being provided with photoelectric devices, of the substrate 560 is provided with the first conductive sheet 570 and the second conductive sheet 580. One end of the first conductive sheet 570 may be electrically coupled with the anode of the laser chip 550 and one end of the second conductive sheet 580 may be electrically coupled with the cathode of the laser chip 550; the other end of the first conductive sheet 570 may extend to the upper surface of the base 530 nearby and be welded with a part of the first pin 510 that protrudes from the upper surface of the base 530; the other end of the second conductive sheet 580 may extend to the upper surface of the base 530 nearby and be welded with a part of the second pin 520 that protrudes from the upper surface of the base 530; and moreover, the parts of the first pin 510 and the second pin 520 that protrude from the upper surface of the base 530 are located at two opposite sides of the optical detector 540 respectively. The position of the optical detector 540 may be set so that the optical detector 540 can detect the laser beam emitted by the laser chip 550. The first pin 510 and the second pin 520 can be electrically coupled with the laser chip 550 respectively through the first conductive sheet 570 and the second conductive sheet 580, thereby shortening the distance of wire bonding and improving the quality of signal transmission between the laser chip 550 and the high speed pins.

In an example, the first conductive sheet 570 and the second conductive sheet 580 may be designed to satisfy the requirement of differential signal transmission so as to ensure the quality of signal transmission.

In an example, the laser chip 550 may be directly fixed on the substrate 560. In this case, electric conductive patterns on the first conductive sheet 570 and the second conductive sheet 580 may be symmetrically designed relative to the laser chip 550, so that the quality of signal transmission is relatively optimal.

Figure 6:
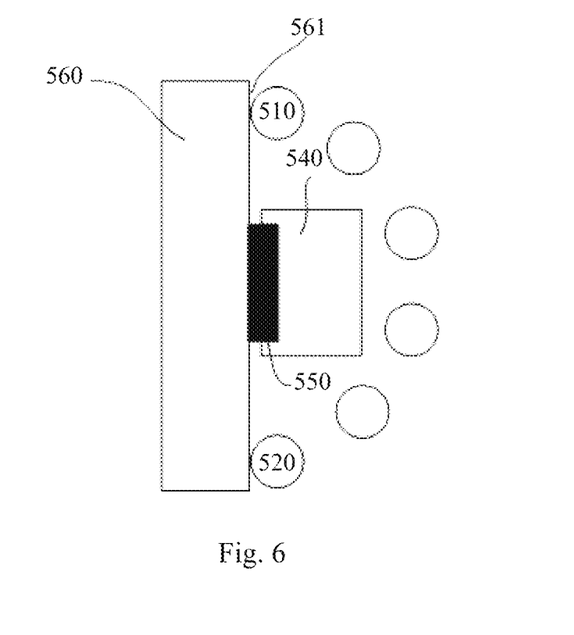
FIG. 6 is a schematic diagram illustrating a top view of a part structure of the TO-CAN packaged laser in FIG. 5.

FIG. 6 is a schematic diagram illustrating a top view of a part structure of a TO-CAN packaged laser 500 in FIG. 5. As shown in FIG. 6, in an example, the side surface 561 of the substrate 560 is provided with the laser chip 550. The optical detector 540 is located under the laser chip 550. The pins are distributed around the optical detector 540 and close to the side surface 561 of the substrate 560. Where, the first pin 510 and/or the second pin 520 may be used as high speed pins and other pins may be used as ordinary pins. The high speed pins may be used to access high speed signals and transmit the high speed signals to the laser chip 550. Taking the second pin 520 as an example, as shown in FIG. 6, when the side surface 561 of the substrate 560 is provided with a high speed circuit, the second pin 520 may be set close to the side surface 561, so that the second pin 520 can be directly contacted with the high speed circuit.

The first pin 510 may also be set in such a way that the first pin 510 is directly contacted with the high speed circuit on the side surface 561 of the substrate 560. In this way, the first pin 510 and the second pin 520 may represent a class of high speed pins. In an example, the TO-CAN packaged laser may include the pins that may be divided into a first class of pins that are directly contacted with conductive sheets and a second class of pins that are not directly contacted with conductive sheets. Where, the first class of pins that are directly contacted with conductive sheets may be used to transmit high speed signals. In the laser 200 shown in FIGS. 2-4, all pins are coupled to the photoelectric devices by wire bonding. When the rate of high speed signals is relatively high, signal transmission requirements may not be satisfied in a case that all the pins are coupled with the photoelectric device by wire bonding. In a practical application scenario, since the devices such as the optical detector 540 and the substrate 560 are desired to be disposed on the upper surface of the base 530, and the spatial arrangement of different pins is taken into consideration, not all pins may be set to be directly contacted with the conductive sheets. As shown in FIG. 6, the pins other than the first pin 510 and the second pin 520 may not be set to be directly contacted with the conductive sheets.

In an example, the laser chip 550 may be a vertical-cavity-surface laser chip. Optical components, such as, mirror, may be adaptively added based on a laser beam emission direction of the vertical-cavity-surface laser chip.

Figure 7:
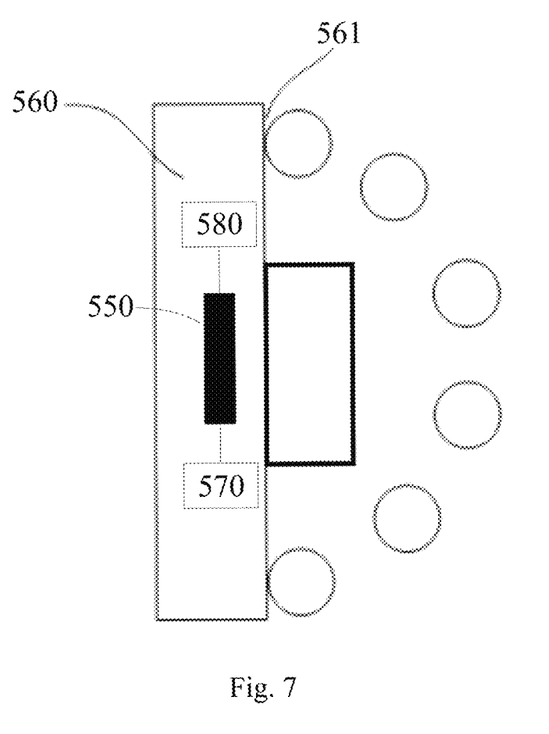
FIG. 7 is a schematic diagram illustrating a top view of a part structure of a TO-CAN packaged laser according to another example of the present disclosure.

In an example, the substrate 560 may be a square body and the laser chip 550 may be provided on an upper surface of the substrate 560 through the first conductive sheet 570 or the second conductive sheet 580. The first conductive sheet 570 or the second conductive sheet 580 may extend on a plurality of adjacent surfaces of the substrate 560. FIG. 7 is a schematic diagram illustrating a top view of a part structure of a TO-CAN packaged laser according to another example of the present disclosure. As shown in FIG. 7, the upper surface of substrate 560 is provided with the first conductive sheet 570, the second conductive sheet 580 and the laser chip 550. The first conductive sheet 570 extends from the side surface of the substrate 560 to the upper surface of the substrate 560, and the second conductive sheet 580 extends from the side surface of the substrate 560 to the upper surface of the substrate 560. The two electrodes of the laser chip 550 are respectively electrically coupled with the first conductive sheet 570 and the second conductive sheet 580. In an example, the first conductive sheet 570 is L-shaped, where a lateral part of the first conductive sheet 570 is disposed on the upper surface of the substrate 560 and a vertical part of the first conductive sheet 570 is disposed on the side surface of the substrate 560; the second conductive sheet 580 is L-shaped, where a lateral part of the second conductive sheet 580 is disposed on the upper surface of the substrate 560 and a vertical part of the second conductive sheet 580 is disposed on the side surface of the substrate 560. In this case, the first pin 510 is coupled with the vertical part of the first conductive sheet 570 by conductive welding flux or conductive paste and the second pin 580 is coupled with the vertical part of the second conductive sheet 580 by conductive welding flux or conductive paste.

In an example, the substrate 560 may include a metal heat sink and an insulating ceramic layer. Where, the insulating ceramic layer may be attached to the metal heat sink. In this case, conductive layers, i.e., the first conductive sheet 570 and the second conductive sheet 580, may be formed by implementing any one of following processes for the insulating ceramic layer. The processes may include metallized ceramic, pulsed deposition, chemical deposition and so on.

In another example, the substrate 560 may include a metal heat sink and an insulating ceramic layer. Where, the insulating ceramic layer may be attached to the metal heat sink. The first conductive sheet 570 and the second conductive sheet 580 may be attached to an outer surface of the insulating ceramic layer.

In still another example, the substrate 560 may include an insulating ceramic material. Conductive layers, i.e., the first conductive sheet 570 and the second conductive sheet 580, may be formed by implementing any one of following processes for the insulating ceramic material. The processes may include metallized ceramic, pulsed deposition, chemical deposition and so on. Where, the metallized ceramic process may include a molybdenum-manganese method, a gold plating method, a copper plating method, a tin plating method, a nickel plating method, a laser activating plating (LAP) method and so on. In an example, gold may be plated on the surface of the ceramics. With good electric conductive performance of the gold, the quality of signal transmission can be ensured. In other examples, other metals such as nickel, tin, copper and so on, may be plated on the surface of the ceramics.

In conclusion, conductive sheets (such as the first conductive sheet 570 and the second conductive sheet 580) may be attached to a surface of the substrate 560 as separated components, or a component of the substrate 560 which are formed by a particular process.

Figure 8:
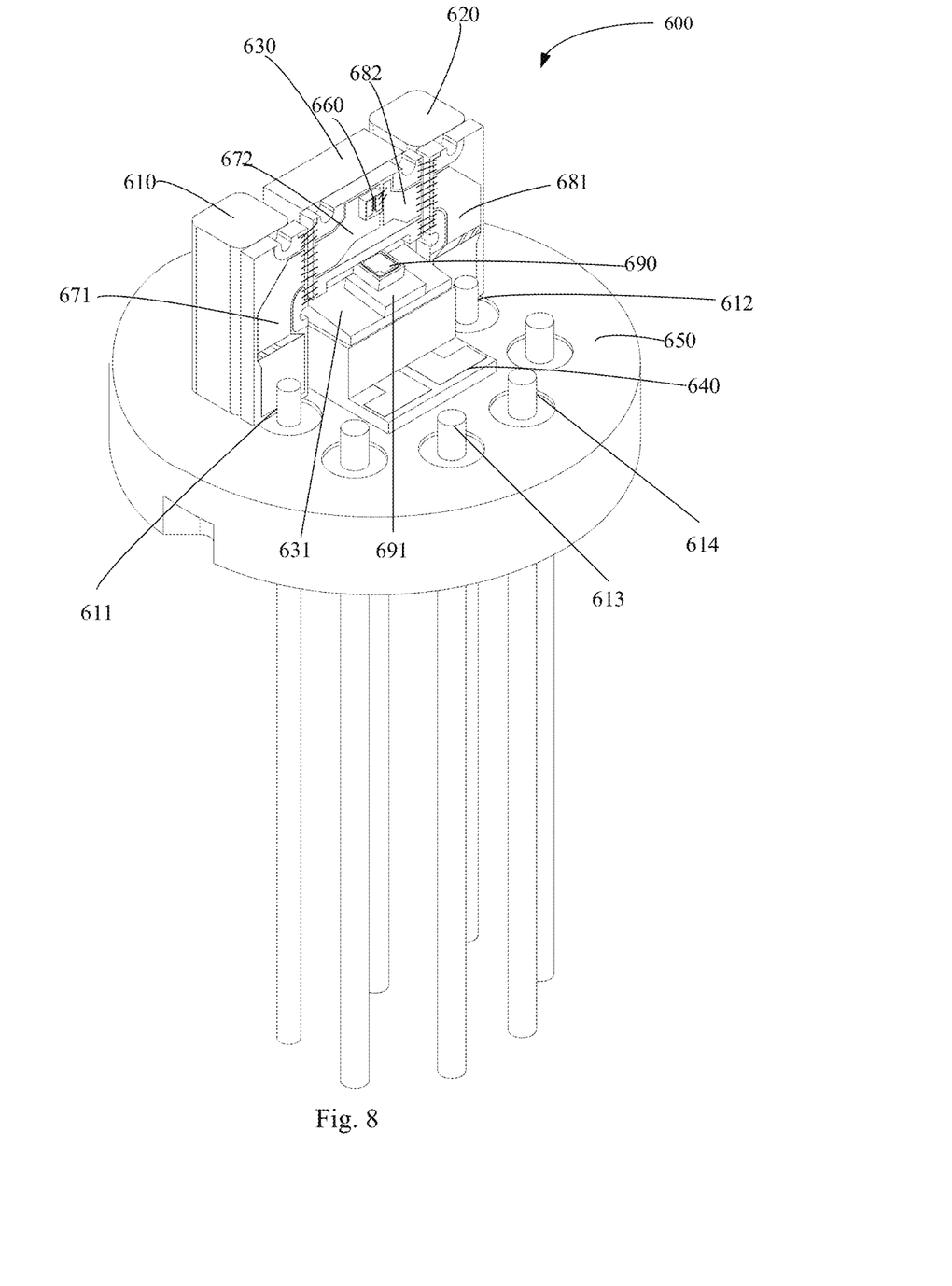
FIG. 8 is a schematic diagram illustrating a structure of a TO-CAN packaged laser according to another example of the present disclosure.
Figure 9:
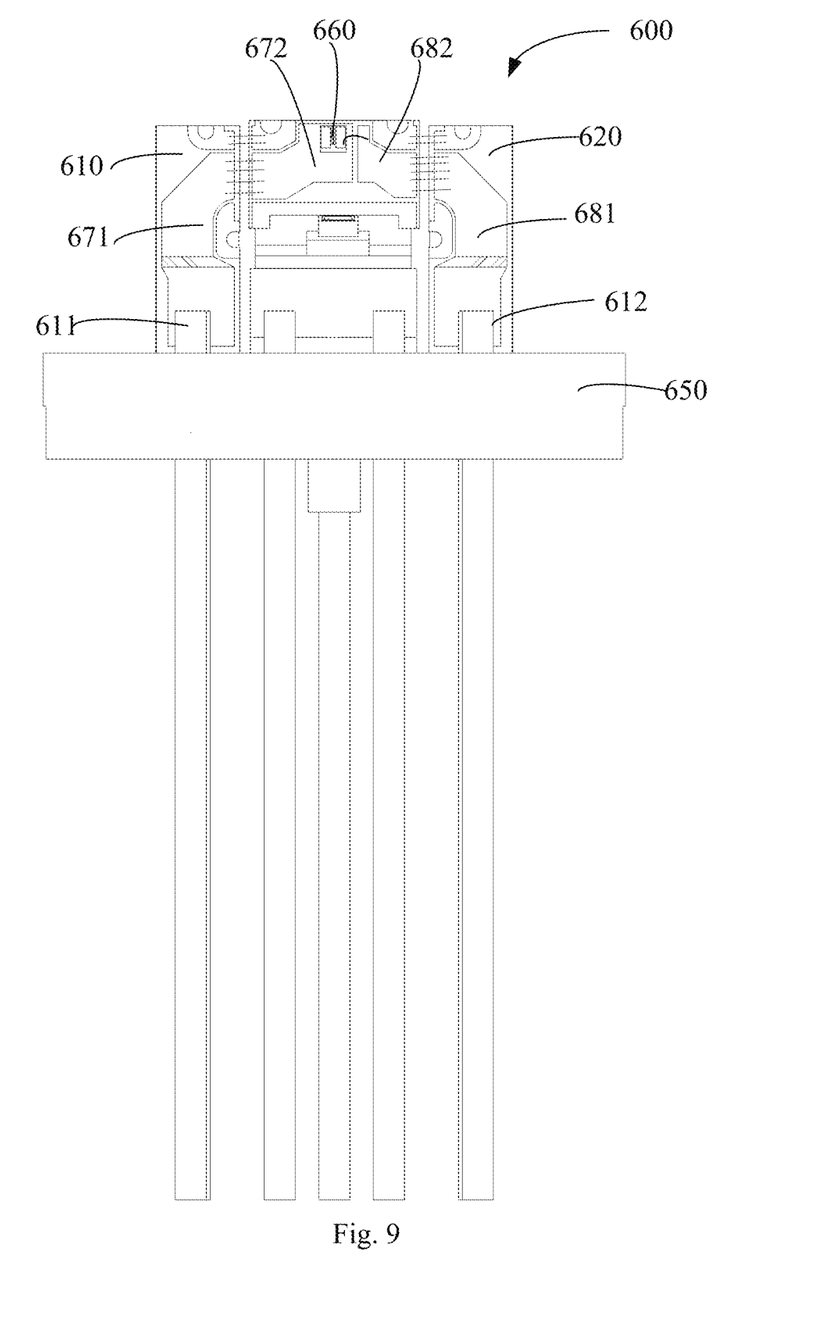
FIG. 9 is a schematic diagram illustrating a sectional view of the TO-CAN packaged laser in FIG. 8.
Figure 10:
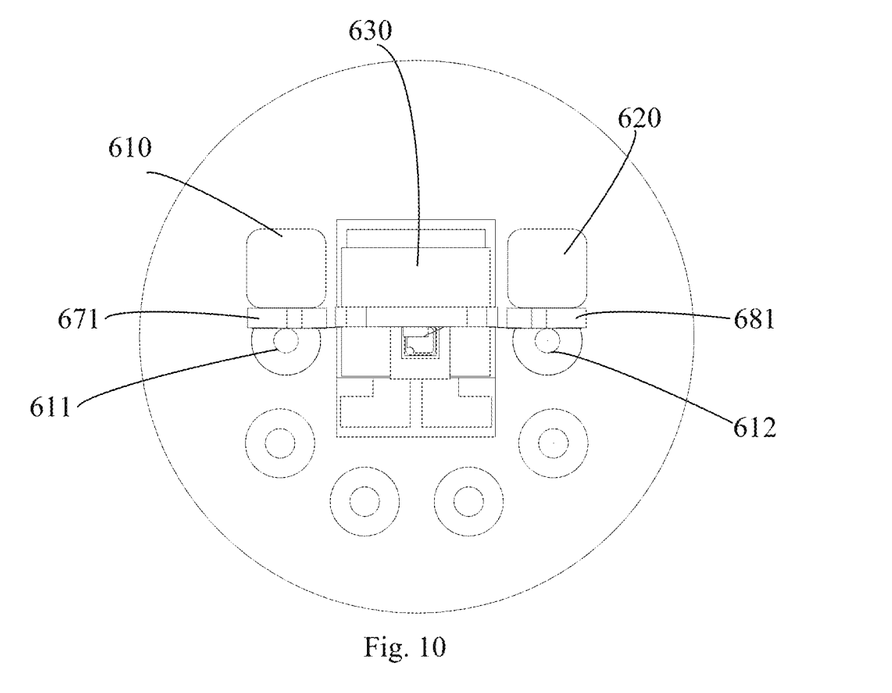
FIG. 10 is a schematic diagram illustrating a top view of the TO-CAN packaged laser in FIG. 8.

FIG. 8 is a schematic diagram illustrating a structure of a TO-CAN packaged laser 600 according to another example of the present disclosure. FIG. 9 is a schematic diagram illustrating a sectional view of the TO-CAN packaged laser shown in FIG. 8. FIG. 10 is a schematic diagram illustrating a top view of the TO-CAN packaged laser shown in FIG. 8. As shown in FIGS. 8-10, a substrate may include a first substrate 610, a heat transfer substrate 630 and a second substrate 620 that are mutually detachable. The first substrate 610 and the second substrate 620 may be located on an upper surface of a base 650 respectively.

A Thermo Electric Cooler (TEC) 640 may be provided on the upper surface of the base 650. The heat transfer substrate 630 may be provided on an upper surface of the TEC 640 and between the first substrate 610 and the second substrate 620. The heat transfer substrate 630 is located on the base 650 by padding the thermoelectric cooler 640. The laser chip 660 may be provided on the heat transfer substrate 630.

The TEC 640 may be an active heat-dissipating electric device that is commonly used in optical modules. The heat transfer substrate 630 may be directly placed on the upper surface of the base 650 to implement heat exchange by directly contacting the base 650. Alternatively, the TEC 640 may be padded between the heat transfer substrate 630 and the base 650. The heat dissipation of the heat transfer substrate 630 may be sped up with the TEC 640.

In an example, a first conductive sheet 670 may include a first conductive sub-sheet 671 and a second conductive sub-sheet 672. The first conductive sub-sheet 671 may be located on a side surface of the first substrate 610 and the second conductive sub-sheet 672 may be located on the side surface of the heat transfer substrate 630. The first conductive sub-sheet 671 and the second conductive sub-sheet 672 may be electrically coupled by wire bonding. Similarly, a second conductive sheet 680 may include a third conductive sub-sheet 681 and a fourth conductive sub-sheet 682. The third conductive sub-sheet 681 may be located on a side surface of the second substrate 620 and the fourth conductive sub-sheet 682 may be located on the side surface of the heat transfer substrate 630. The third conductive sub-sheet 681 and the fourth conductive sub-sheet 682 may be electrically coupled by wire bonding. The laser chip 660 is disposed on the heat transfer substrate 630 with the second conductive sub-sheet 672 or the fourth conductive sub-sheet 682, i.e., the laser chip 660 may be attached on the second conductive sub-sheet 672 or the fourth conductive sub-sheet 682.

In an example, as shown in FIG. 8, the laser chip 660 is fixed on the side surface of the heat transfer substrate 630 by being attached on the second conductive sub-sheet 672, and at the same time the electrical connection between the anode of the laser chip 660 and the second conductive sub-sheet 672 is implemented. The cathode of the laser chip 660 may be electrically coupled with the fourth conductive sub-sheet 682 through wire bonding.

In an example, as shown in FIG. 8, the laser chip 660 is fixed on the side surface of the heat transfer substrate 630 by being attached on the second conductive sub-sheet 672, and at the same time the electrical connection between the cathode of the laser chip 660 and the second conductive sub-sheet 672 is implemented. The anode of the laser chip 660 may be electrically coupled with the fourth conductive sub-sheet 682 through wire bonding.

In an example, the laser chip 660 may be coupled with the second conductive sub-sheet 672 and the fourth conductive sub-sheet 682 by wire bonding. For example, the laser chip 660 is directly fixed on the heat transfer substrate 630. The two electrode of the laser chip 660 is respectively electrically coupled with the second conductive sub-sheet 672 and the fourth conductive sub-sheet 682. The TEC 640 may be provided under the heat transfer substrate 630. The TEC 640 may be directly contacted with the upper surface of the base 650, so that the heat transfer substrate 630 may accelerate heat dissipation through the TEC 640.

The laser chip 660 may be located on the side surface of the heat transfer substrate 630 and the heat generated by the laser chip 660 may be transferred to the base 650 for heat dissipation through the heat transfer substrate 630 and the TEC 640.

In an example, an optical detector 690 may be provided on the TEC 640 through a sub-substrate 691. The sub-substrate 691 is located on the thermoelectric cooler 640. The optical detector 690 is disposed on the sub-substrate 691.

In an example, to enlarge an area of dissipation between the heat transfer substrate 630 and the TEC 640, the heat transfer substrate 630 is of a L-shaped structure, and in this case, the sub-substrate 691 is located on a lateral part 631 of the L-shaped structure.

In another example, a heat sink or heat transfer adhesive may be padded between the optical detector 690 and the TEC 640, to adjust the position of the optical detector 690 and speed up the heat exchange between the optical detector 690 and the TEC 640.

Heat dissipation of the laser chip 660 may be implemented by the heat transfer substrate 630. The TEC 640 as the active heat-dissipating device may have a higher heat exchange rate than the heat transfer substrate 630, while the heat transfer substrate 630 may have a higher heat exchange rate than the first substrate 610 and the second substrate 620. In an example, the first substrate 610, the second substrate 620 and the heat transfer substrate 630 may include a metal heat sink. The first conductive sub-sheet 671, the second conductive sub-sheet 672, the third conductive sub-sheet 681 and the fourth conductive sub-sheet 682 may be formed by processes such as metallized ceramic, pulsed deposition, chemical deposition and so on, or attached conductive sheets. In addition, the first conductive sheet 670 and the second conductive sheet 680 may be designed to satisfy the requirement of differential signal transmission so as to ensure the quality of signal transmission.

In an example, electric conductive patterns on the first conductive sheet 670 and the second conductive sheet 680 may be symmetrically designed. In an example, electric conductive patterns on the first conductive sub-sheet 671 and the third conductive sub-sheet 681 may be symmetrically designed relative to the laser chip 660.

The first conductive sub-sheet 671 and the second conductive sub-sheet 672 may be electrically coupled through a plurality of gold wires. The third conductive sub-sheet 681 and the fourth conductive sub-sheet 682 may also be electrically coupled through a plurality of gold wires. The plurality of gold wires may reduce parasitic inductance. Moreover, based on good electric conductive performance of the gold wires, the electric conductivity and the signal transmission quality between the laser chip 660 and the first conductive sheet 670 as well as the second conductive sheet 680 may be ensured.

As shown in FIG. 8, the TO-CAN packaged laser 600 may further include at least two pins. The first conductive sub-sheet 671 may be close to a first pin 611 and the third conductive sub-sheet 681 may be close to a second pin 612. The first conductive sub-sheet 671 and the first pin 611 may be coupled through conductive welding flux or conductive paste. The third conductive sub-sheet 681 and the second pin 612 may be coupled through conductive welding flux or conductive paste. Wire bonding may be replaced with the filling of the conductive welding flux or the conductive paste. Parasitic parameters generated by the wire bonding can be avoided, thereby facilitating signal transmission.

In an example, the laser chip 660 may be an edge-emitting laser chip. To make a laser beam emitted by the laser chip 660 vertical to the upper surface of the base 650, as shown in FIG. 8, the laser chip 660, the second conductive sub-sheet 672 and the fourth conductive sub-sheet 682 are provided on the side surface of the heat transfer substrate 630, the first conductive sub-sheet 671 is provided on the side surface of the first substrate 610, and the third conductive sub-sheet 681 is provided on the side surface of the second substrate 620.

Figure 11:
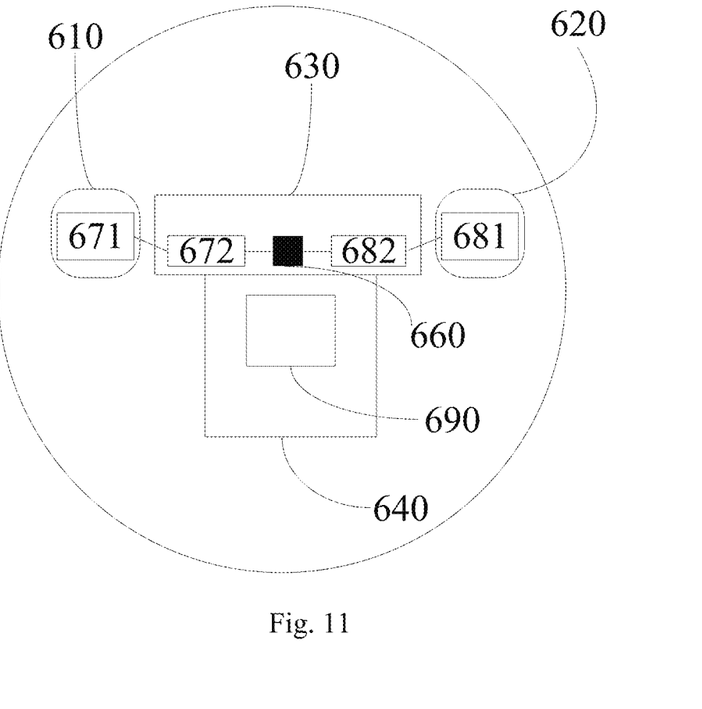
FIG. 11 is a schematic diagram illustrating a top view of a part structure of a TO-CAN packaged laser according to an example of the present disclosure.

In another example, the laser chip 660 may be a surface-emitting laser chip. FIG. 11 is a schematic diagram illustrating a top view of a part structure of a TO-CAN packaged laser according to an example of the present disclosure. As shown in FIG. 11, the upper surface of the heat transfer substrate 630 is provided with the second conductive sub-sheet 672, the fourth conductive sub-sheet 682 and the laser chip 660. The first conductive sub-sheet 671 may extends from the side surface, close to the first pin 611, of the first substrate 610 to the upper surface of the first substrate 610. The third conductive sub-sheet 681 may extends from the side surface, close to the second pin 612, of the second substrate 620 to the upper surface of the second substrate 620. In an example, the first conductive sheet 671 is L-shaped and the first pin 611 is coupled with a vertical part of the first conductive sub-sheet 671 by conductive welding flux or conductive paste; and the third conductive sheet 681 is L-shaped and the second pin 612 is coupled with a vertical part of the third conductive sub-sheet 681 by conductive welding flux or conductive paste. In this way, filling of conductive welding flux between the first pin 611 and the first conductive sub-sheet 671 will be relatively less and more stable. Similarly, filling of conductive welding flux between the second pin 612 and the third conductive sub-sheet 681 will be relatively less and more stable.

As shown in FIGS. 8-10, the base 650 may be a metallic cylinder from which six pins may protrude. The laser chip 660 may be located on the base 650. Since the TEC 640 is provided on the upper surface of the base 650 and the laser chip 660 having a smaller volume than the TEC 640 is provided above the TEC 640, the pins may be arranged around the TEC 640 to set aside a space for placing the TEC 640. Due to the presence of the TEC 640, a distance between the pins and the laser chip 660 is relatively longer. Glass seal may be used between the base 650 and the pins for packaging, which may improve qualification rate and reliability of packaged devices.

In an example, the optical detector 690 may be electrically coupled to external through two pins 613, 614.

To sum up, the first substrate 610, the second substrate 620, the heat transfer substrate 630 and the TEC 640 may be mutually cooperated, which will not only facilitate heat dissipation of the laser chip 660 but also shorten the distance of wire bonding between the laser chip 660 and the pins, thereby satisfying the requirement of high frequency signal transmission.

According to an example of the present disclosure, there is also provided an optical module including the TO-CAN packaged lasers provided in examples described above.

The above is merely a part of examples of the present disclosure and is not intended to limit the protection scope of the present disclosure. Any equivalent structural changes made based on the description and the accompanying drawings of the present disclosure will be encompassed in the scope of protection of the present disclosure.

The invention claimed is:
1. A TO-CAN packaged laser, comprising:
   a base;
   a first substrate located on the base, wherein the first substrate is provided with a first conductive sub-sheet and comprises a first metal heat sink;
   a second substrate located on the base, wherein the second substrate is provided with a third conductive sub-sheet and comprises a second metal heat sink;
   a heat transfer substrate located on the base and between the first substrate and the second substrate, wherein the heat transfer substrate is provided with a second conductive sub-sheet and a fourth conductive sub-sheet, the heat transfer substrate have a higher heat exchange rate than the first substrate and the second substrate, and the heat transfer substrate comprises a third metal heat sink;
   a laser chip provided on the heat transfer substrate, wherein an anode of the laser chip is electrically coupled with the second conductive sub-sheet and a cathode of the laser chip is electrically coupled with the fourth conductive sub-sheet; and
   a first pin and a second pin that protrude from the base, wherein the first pin is coupled with the first conductive sub-sheet by conductive welding flux or conductive paste and the second pin is coupled with the third conductive sub-sheet by conductive welding flux or conductive paste.

2. The laser of claim 1, wherein the laser chip is attached on the second conductive sub-sheet or the fourth conductive sub-sheet.

3. The laser of claim 1, wherein,
   the laser chip is disposed on an upper surface of the heat transfer substrate away from the base, wherein the upper surface of the heat transfer substrate is parallel with a surface of the base on which the first substrate, the second substrate and the heat transfer substrate are provided.

4. The laser of claim 3, wherein the second conductive sub-sheet and the fourth conductive sub-sheet are provided in one of the following:

a first manner comprising:
  the second conductive sub-sheet extends from a side surface of the heat transfer substrate to the upper surface of the heat transfer substrate, wherein the side surface of the heat transfer substrate is perpendicular to the surface of the base on which the first substrate, the second substrate and the heat transfer substrate are provided, and
  the fourth conductive sub-sheet extends from the side surface of the heat transfer substrate to the upper surface of the heat transfer substrate;
a second manner comprising:
  the second conductive sub-sheet is provided on the upper surface of the heat transfer substrate, and
  the fourth conductive sub-sheet is provided on the upper surface of the heat transfer substrate;
a third manner comprising:
  the second conductive sub-sheet is provided on the upper surface of the heat transfer substrate, and
  the fourth conductive sub-sheet extends from the side surface of the heat transfer substrate to the upper surface of the heat transfer substrate; and
a fourth manner comprising:
  the second conductive sub-sheet extends from a side surface of the heat transfer substrate to the upper surface of the heat transfer substrate, and
  the fourth conductive sub-sheet is provided on the upper surface of the heat transfer substrate.

5. The laser of claim 3, wherein the first conductive sub-sheet and the third conductive sub-sheet are provided in one of following:
a first manner comprising:
  the first conductive sub-sheet extends from a side surface of the first substrate to an upper surface of the first substrate away from the base, wherein the side surface of the first substrate is perpendicular to the surface of the base on which the first substrate, the second substrate and the heat transfer substrate are provided, and the upper surface of the first substrate is parallel with the surface of the base on which the first substrate, the second substrate and the heat transfer substrate are provided, and
  the third conductive sub-sheet extends from a side surface of the second substrate to an upper surface of the second substrate away from the base, wherein the side surface of the second substrate is perpendicular to the surface of the base on which the first substrate, the second substrate and the heat transfer substrate are provided, and the upper surface of the second substrate is parallel with the surface of the base on which the first substrate, the second substrate and the heat transfer substrate are provided;
a second manner comprising:
  the first conductive sub-sheet extends from the side surface of the first substrate to an upper surface of the first substrate away from the base, and
  the third conductive sub-sheet is provided on the side surface of the second substrate; and
a third manner comprises:
  the first conductive sub-sheet is provided on the side surface of the first substrate, and
  the third conductive sub-sheet extends from a side surface of the second substrate to an upper surface of the second substrate away from the base; and
a fourth manner comprises:
  the first conductive sub-sheet is provided on the side surface of the first substrate, and
  the third conductive sub-sheet is provided on the side surface of the second substrate.

6. The laser of claim 1, further comprises:
an optical detector.

7. The laser of claim 1, further comprising:
a thermoelectric cooler between the heat transfer substrate and the base.

8. The laser of claim 7, further comprises:
a sub-substrate on the thermoelectric cooler; and
an optical detector located on the sub-substrate.

9. The laser of claim 7, wherein the heat transfer substrate is of a L-shaped structure; and
the laser further comprises:
  a sub-substrate on a lateral part of the L-shaped structure; and
  an optical detector located on the sub-substrate.

10. The laser of claim 1, wherein,
the first conductive sub-sheet and the second conductive sub-sheet are coupled through wire bonding; and
the third conductive sub-sheet and the fourth conductive sub-sheet are coupled through wire bonding.

11. An optical module including a TO-CAN packaged laser, wherein the TO-CAN packaged laser comprises:
a base;
a first substrate located on the base, wherein the first substrate is provided with a first conductive sub-sheet and comprises a first metal heat sink;
a second substrate located on the base, wherein the second substrate is provided with a third conductive sub-sheet and comprises a second metal heat sink;
a heat transfer substrate located on the base and between the first substrate and the second substrate, wherein the heat transfer substrate is provided with a second conductive sub-sheet and a fourth conductive sub-sheet, the heat transfer substrate have a higher heat exchange rate than the first substrate and the second substrate, and the heat transfer substrate comprises a third metal heat sink;
a laser chip provided on the heat transfer substrate, wherein an anode of the laser chip is electrically coupled with the second conductive sub-sheet and a cathode of the laser chip is electrically coupled with the fourth conductive sub-sheet; and
a first pin and a second pin that protrude from the base, wherein the first pin is coupled with the first conductive sub-sheet by conductive welding flux or conductive paste and the second pin is coupled with the third conductive sub-sheet by conductive welding flux or conductive paste.

12. The optical module of claim 11, wherein the laser chip is attached on the second conductive sub-sheet or the fourth conductive sub-sheet.

13. The optical module of claim 11, wherein,
the laser chip is disposed on an upper surface of the heat transfer substrate away from the base, wherein the upper surface of the heat transfer substrate is parallel with a surface of the base on which the first substrate, the second substrate and the heat transfer substrate are provided.

14. The optical module of claim 13, wherein the second conductive sub-sheet and the fourth conductive sub-sheet are provided in one of following:
a first manner comprises:
  the second conductive sub-sheet extends from a side surface of the heat transfer substrate to the upper surface of the heat transfer substrate, wherein the side surface of the heat transfer substrate is perpendicular to the surface of the base on which the first substrate, the second substrate and the heat transfer substrate are provided, and the fourth conductive sub-sheet extends from the side surface of the heat transfer substrate to the upper surface of the heat transfer substrate;

a second manner comprises:
the second conductive sub-sheet is provided on the upper surface of the heat transfer substrate, and
the fourth conductive sub-sheet is provided on the upper surface of the heat transfer substrate;

a third manner comprises:
the second conductive sub-sheet is provided on the upper surface of the heat transfer substrate, and
the fourth conductive sub-sheet extends from the side surface of the heat transfer substrate to the upper surface of the heat transfer substrate; and a fourth manner comprises:
the second conductive sub-sheet extends from a side surface of the heat transfer substrate to the upper surface of the heat transfer substrate, and
the fourth conductive sub-sheet is provided on the upper surface of the heat transfer substrate.

15. The optical module of claim 13, wherein the first conductive sub-sheet and the third conductive sub-sheet are provided in of the following:

a first manner comprises:
the first conductive sub-sheet extends from a side surface of the first substrate to an upper surface of the first substrate away from the base, wherein the side surface of the first substrate is perpendicular to the surface of the base on which the first substrate, the second substrate and the heat transfer substrate are provided, and the upper surface of the first substrate is parallel with the surface of the base on which the first substrate, the second substrate and the heat transfer substrate are provided, and
the third conductive sub-sheet extends from a side surface of the second substrate to an upper surface of the second substrate away from the base, wherein the side surface of the second substrate is perpendicular to the surface of the base on which the first substrate, the second substrate and the heat transfer substrate are provided, and the upper surface of the second substrate is parallel with the surface of the base on which the first substrate, the second substrate and the heat transfer substrate are provided;

a second manner comprises:
the first conductive sub-sheet extends from the side surface of the first substrate to an upper surface of the first substrate away from the base, and
the third conductive sub-sheet is provided on the side surface of the second substrate; and a third manner comprises:
the first conductive sub-sheet is provided on the side surface of the first substrate, and
the third conductive sub-sheet extends from a side surface of the second substrate to an upper surface of the second substrate away from the base; and a fourth manner comprises:
the first conductive sub-sheet is provided on the side surface of the first substrate, and
the third conductive sub-sheet is provided on the side surface of the second substrate.

16. The optical module of claim 11, wherein,
the first conductive sub-sheet and the second conductive sub-sheet are coupled through wire bonding; and
the third conductive sub-sheet and the fourth conductive sub-sheet are coupled through wire bonding.

17. A TO-CAN packaged laser, comprising:
a base;
a first substrate located on the base, wherein the first substrate is provided with a first conductive sub-sheet, wherein the first conductive sheet is L-shaped, a lateral part of the first conductive sub-sheet is attached on an upper surface of the first substrate, a vertical part of the first conductive sub-sheet is attached on a side surface of the first substrate, the upper surface of the first substrate is parallel with a surface of the base on which the first substrate is located, and the side surface of the first substrate is perpendicular to the surface of the base on which the first substrate is located;
a second substrate located on the base, wherein the second substrate is provided with a third conductive sub-sheet, wherein the third conductive sheet is L-shaped, a lateral part of the third conductive sub-sheet is attached on an upper surface of the second substrate, a vertical part of the third conductive sub-sheet is attached on a side surface of the second substrate, the upper surface of the second substrate is parallel with the surface of the base, and the side surface of the second substrate is perpendicular to the surface of the base;
a heat transfer substrate located on the base and between the first substrate and the second substrate, wherein the heat transfer substrate is provided with a second conductive sub-sheet and a fourth conductive sub-sheet, the second conductive sub-sheet is provided on an upper surface of the heat transfer substrate, the fourth conductive sub-sheet is provided on the upper surface of the heat transfer substrate, the upper surface of the heat transfer substrate is parallel with the surface of the base;
a laser chip provided on the upper surface of the heat transfer substrate, wherein an anode of the laser chip is electrically coupled with the second conductive sub-sheet and a cathode of the laser chip is electrically coupled with the fourth conductive sub-sheet; and
a first pin and a second pin that protrude from the base, wherein the first pin is coupled with the vertical part of the first conductive sub-sheet by conductive welding flux or conductive paste and the second pin is coupled with the vertical part of the third conductive sub-sheet by conductive welding flux or conductive paste.

18. The laser of claim 17, wherein the second conductive sub-sheet extends from a side surface of the heat transfer substrate to the upper surface of the heat transfer substrate, wherein the side surface of the heat transfer substrate is perpendicular to the surface of the base;
the fourth conductive sub-sheet extends from the side surface of the heat transfer substrate to the upper surface of the heat transfer substrate.

* * * * *